(12) United States Patent
Morimoto et al.

(10) Patent No.: US 11,147,163 B2
(45) Date of Patent: Oct. 12, 2021

(54) SEMICONDUCTOR MODULE UNIT

(71) Applicant: Yazaki Corporation, Tokyo (JP)

(72) Inventors: Mitsuaki Morimoto, Shizuoka (JP); Eiichiro Oishi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/814,346

(22) Filed: Mar. 10, 2020

(65) Prior Publication Data

US 2020/0214132 A1 Jul. 2, 2020

Related U.S. Application Data

(63) Continuation of application No. PCT/JP2018/021870, filed on Jun. 7, 2018.

(30) Foreign Application Priority Data

Oct. 12, 2017 (JP) .............................. JP2017-198252

(51) Int. Cl.
*H05K 1/00* (2006.01)
*H05K 1/14* (2006.01)
*H02K 11/33* (2016.01)
*B60L 53/22* (2019.01)
*H01R 12/79* (2011.01)

(52) U.S. Cl.
CPC .............. *H05K 1/147* (2013.01); *B60L 53/22* (2019.02); *H01R 12/79* (2013.01); *H02K 11/33* (2016.01); *H02K 2211/03* (2013.01); *H05K 2201/09027* (2013.01); *H05K 2201/10409* (2013.01)

(58) Field of Classification Search
CPC .... H05K 1/147; H02K 11/33; H02K 2211/03; B60L 53/22; H01R 12/79
USPC ......................................................... 361/749
See application file for complete search history.

(56) References Cited

U.S. PATENT DOCUMENTS

| 10,091,903 B2 * | 10/2018 | Hara ..................... H05K 7/1432 |
| 2012/0188712 A1 * | 7/2012 | Ishibashi ............... H02M 7/003 |
| | | 361/688 |
| 2013/0128643 A1 | 5/2013 | Shinohara et al. |
| 2014/0035118 A1 * | 2/2014 | Bayerer .................. H01L 23/36 |
| | | 257/690 |

FOREIGN PATENT DOCUMENTS

| JP | 10-146066 A | 5/1998 |
| JP | 2009-194317 | * 8/2009 |
| JP | 2009-194317 A | 8/2009 |
| JP | 2012-129491 A | 7/2012 |
| JP | 2014-161227 A | 9/2014 |

* cited by examiner

*Primary Examiner* — Andargie M Aychillhum
(74) *Attorney, Agent, or Firm* — Sughrue Mion, PLLC

(57) ABSTRACT

A semiconductor module unit includes a semiconductor module, and a control board that includes a driver circuit configured to output drive signals to the semiconductor module and controls the semiconductor module. The control board includes a main board, a sub board that is separated from the main board and on which the driver circuit is mounted, and a flexible board that has flexibility and electrically connects the main board and the sub board. The sub board includes a fitting part that is fitted in a fitted part of the semiconductor module. The semiconductor module is electrically connected to the driver circuit in a state where the fitting part is fitted in the fitted part.

6 Claims, 7 Drawing Sheets

SEMICONDUCTOR MODULE UNIT

CROSS-REFERENCE TO RELATED APPLICATION(S)

This application is a continuation application of International Application PCT/JP2018/021870, filed on Jun. 7, 2018, and designating the U.S., the entire contents of which are incorporated herein by reference.

BACKGROUND OF THE INVENTION

1. Field of the Invention

The present invention relates to a semiconductor module unit.

2. Description of the Related Art

Conventionally, there are known electric vehicles (EV), hybrid vehicles (HEV), plug-in hybrid vehicles (PHEV), and the like that are provided with a motor as a driving source of the vehicle. Such vehicles are equipped with an inverter converting DC power supplied from a high-voltage battery into AC power. A power semiconductor is being adopted for the inverter. As a large current is passed through the power semiconductor, there is adopted not a normal size of package but a module-type of large package (semiconductor module). It is not rare to customize the shape of a semiconductor module depending on the application to be used, and some semiconductor modules have a structure allowing easy heat radiation (see Patent Japanese Patent Application Laid-open No. 2014-161227, for example).

Moreover, Japanese Patent Application Laid-open No. 2009-194317 describes that the extra length of the flexible board causes band deterioration of electric signals transmitted and received between the optical element module and the signal generation circuit, which may deteriorate transmission characteristics of the light transmission module.

Conventionally, in assembling work of a semiconductor module unit, after a semiconductor module is fixed to a heat radiation part and the like and a control board controlling the semiconductor module is aligned, the semiconductor module and the control board are electrically connected by soldering. Thus, there remains room for improvement in assembling workability of the semiconductor module unit. Meanwhile, if a distance between the semiconductor module and the control board is made longer to secure assembling workability, inductor components are increased, which may cause noises.

SUMMARY OF THE INVENTION

The invention aims at providing a semiconductor module unit capable of improving assembling operability and reducing occurrence of noises.

Solution to Problem

A semiconductor module unit according to one aspect of the present invention includes a semiconductor module that includes at least a semiconductor element; and a control board that includes a driver circuit configured to output a drive signal to the semiconductor module and controls the semiconductor module, wherein the control board includes a main board, a sub board that is separated from the main board and on which the driver circuit is mounted, and a flexible board that has flexibility and electrically connects the main board and the sub board, the sub board includes a fitting part that is fitted in a fitted part of the semiconductor module, and the semiconductor module is electrically connected to the driver circuit when the fitting part is fitted in the fitted part.

According to another aspect of the present invention, in the semiconductor module unit, it is preferable that the fitting part includes a projecting portion that is formed in a projecting shape projecting outward from an outer peripheral end of the sub board, and a connecting portion that is arranged in the projecting portion and is electrically connected to a connected portion of the fitted part, and the fitted part includes a recessed portion that is formed in a recessed shape corresponding to the projecting portion, and a connected portion that is arranged at a position facing the connecting portion when the projecting portion is fitted in the recessed portion.

According to still another aspect of the present invention, in the semiconductor module unit, it is preferable that the fitting part includes a recessed-projecting portion that is formed in a recessed-projecting shape on a part of an outer peripheral end of the sub board, and a connecting portion that is arranged on the recessed-projecting portion and is electrically connected to a connected portion of the fitted part, and the fitted part includes a projecting-recessed portion that is formed in a projecting-recessed shape corresponding to the recessed-projecting portion, and a connected portion that is arranged at a position facing the connecting portion when the recessed-projecting portion is fitted in the projecting-recessed portion.

According to still another aspect of the present invention, in the semiconductor module unit, it is preferable that one of the connecting portion and the connected portion is formed to be elastically deformable in a facing direction of the connecting portion and the connected portion.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

The following will describe in detail embodiments of a semiconductor module unit according to the invention with reference to the enclosed drawings. Note that the embodiments do not limit the invention. Moreover, the components in the following embodiments include components that a person skilled in the art could easily arrive at or components that are substantially the same. Furthermore, the components in the following embodiments may be variously omitted, replaced, or modified without departing from the scope of the invention. In addition, the configurations described above may be combined appropriately.

First Embodiment

Figure 1:
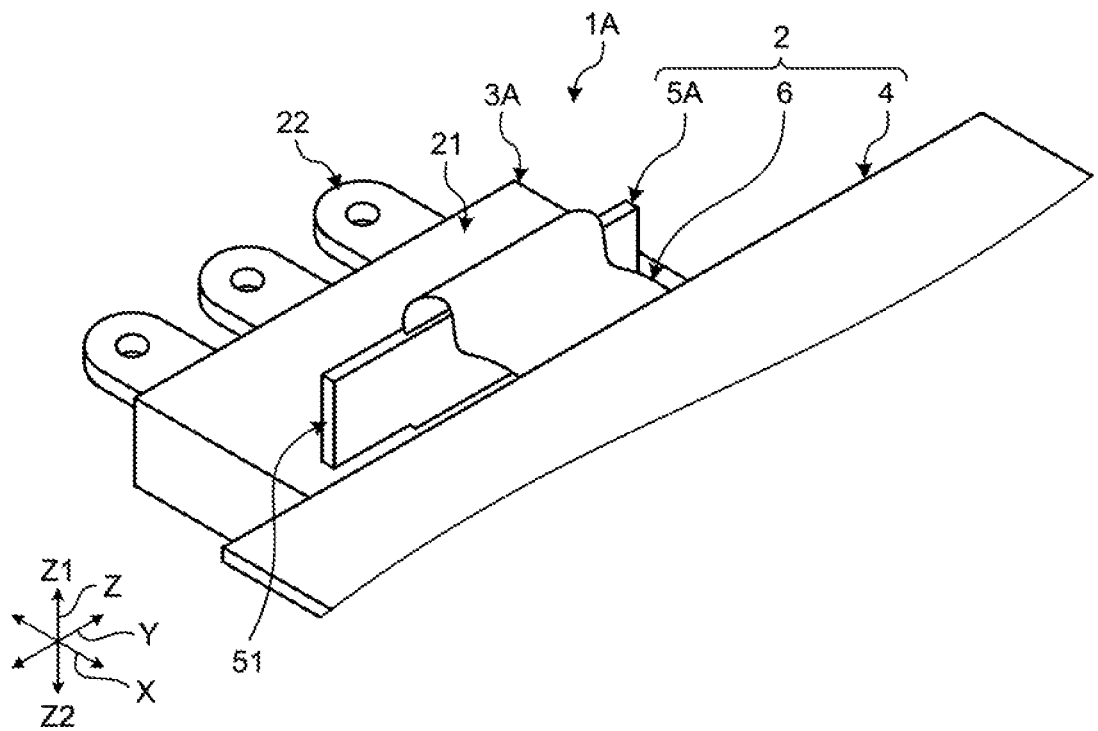
FIG. 1 is a perspective view illustrating a schematic configuration of a semiconductor module unit according to a first embodiment.
Figure 2:
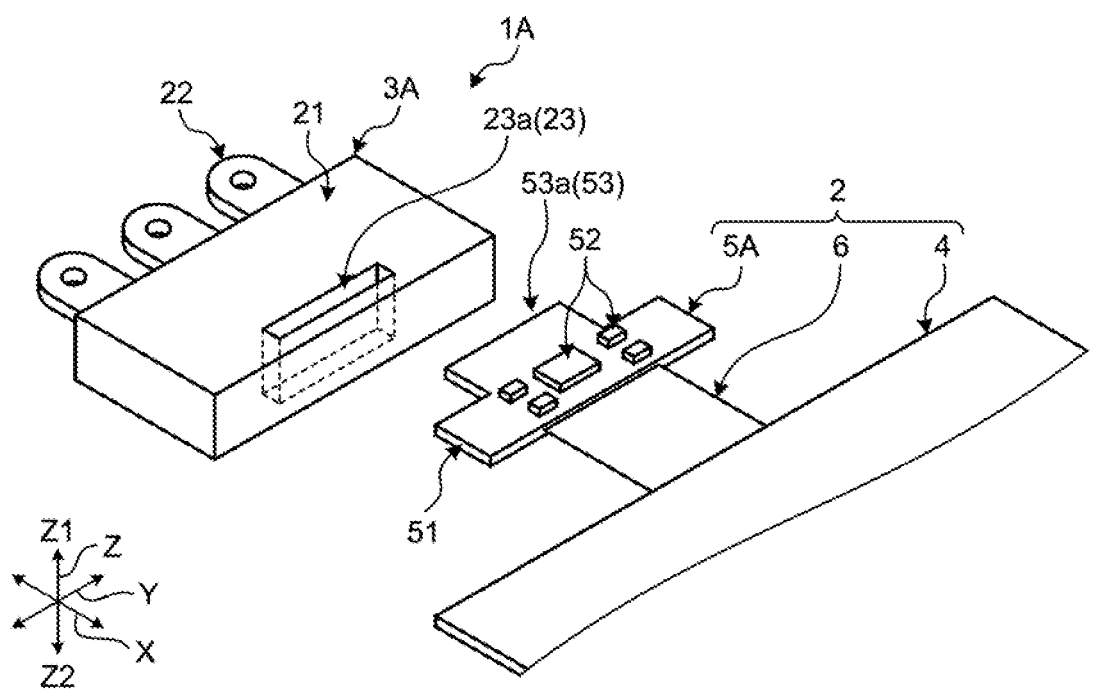
FIG. 2 is an exploded perspective view illustrating a schematic configuration of the semiconductor module unit according to the first embodiment.
Figure 3:
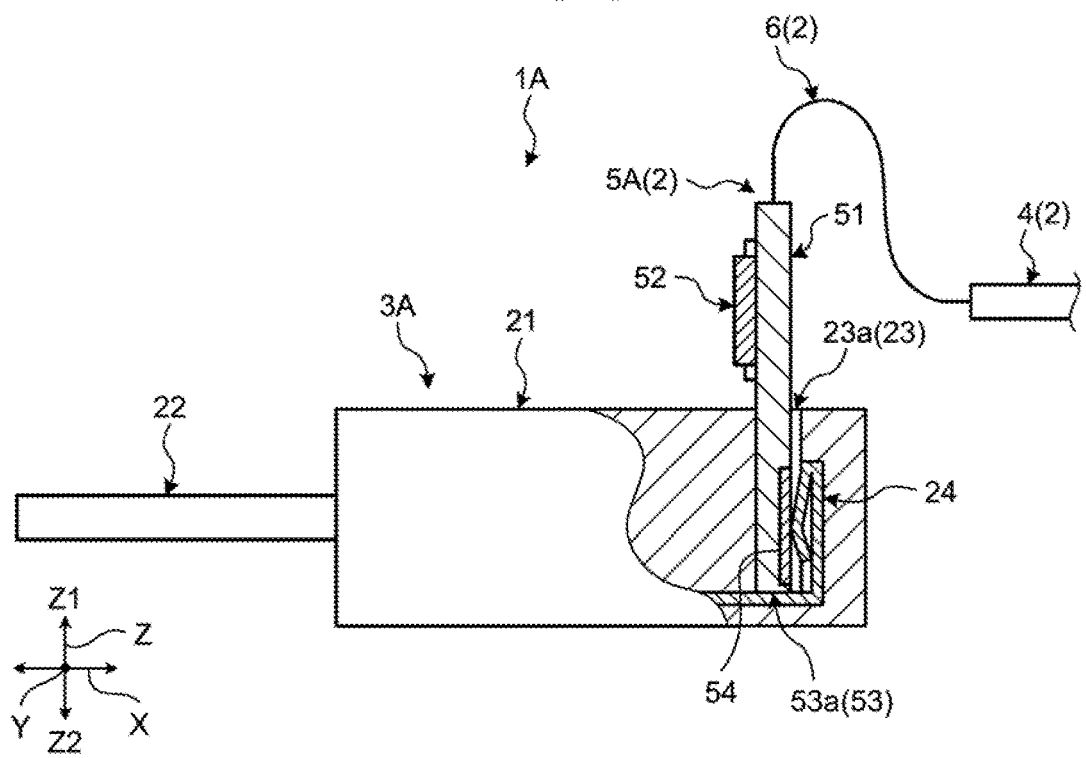
FIG. 3 is a longitudinal section view of a main part of the semiconductor module unit according to the first embodiment.
Figure 4:
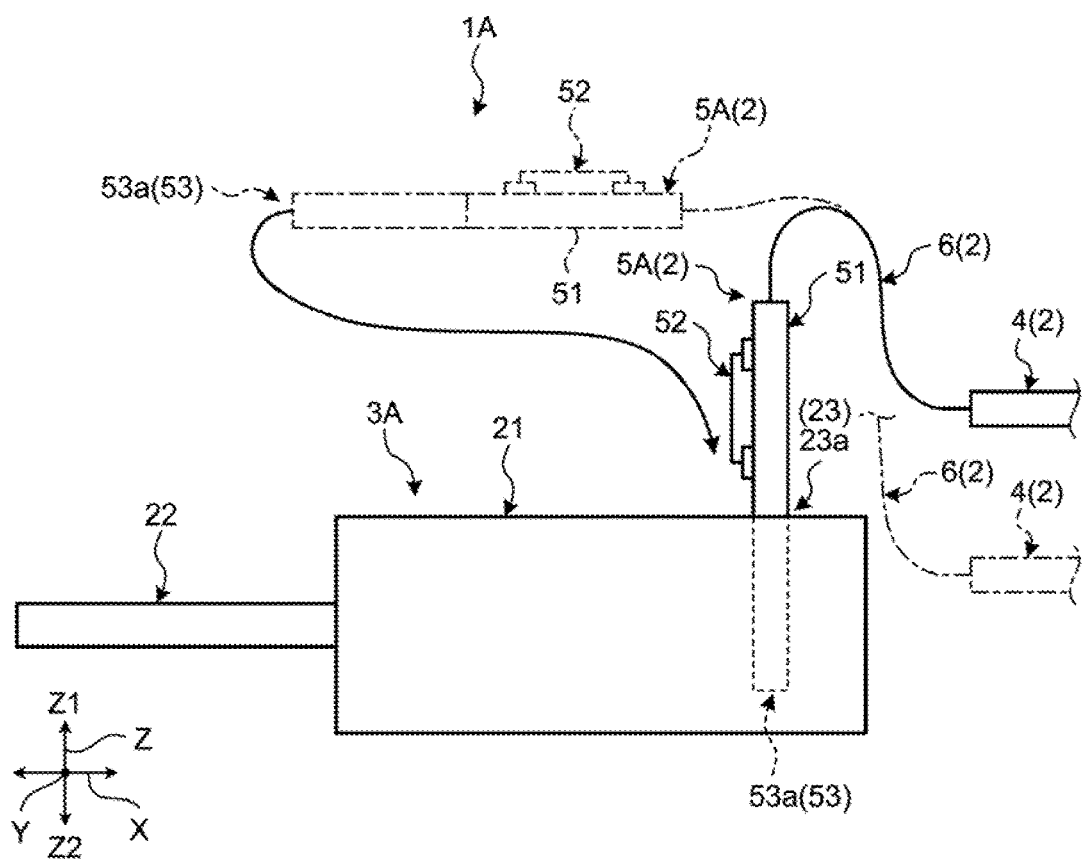
FIG. 4 is a side view of the main part of the semiconductor module unit according to the first embodiment.

FIG. 1 is a perspective view illustrating a schematic configuration of a semiconductor module according to the first embodiment. FIG. 2 is an exploded perspective view illustrating a schematic configuration of the semiconductor module unit according to the first embodiment. FIG. 3 is a longitudinal section view of a main part of the semiconductor module unit according to the first embodiment. FIG. 4 is a side view of the main part of the semiconductor module unit according to the first embodiment. Note that FIG. 1 and FIG. 3 (same in FIG. 5, FIG. 8, FIG. 10, and FIG. 11) are diagrams illustrating the state in which a control board is assembled in the semiconductor module. Moreover, FIG. 1 to FIG. 4 (same in FIG. 5 to FIG. 12) omit a part of a main board forming the semiconductor module unit, and omit electronic parts and the like mounted on the main board. Moreover, FIG. 1 to FIG. 4 (same in FIG. 5 to FIG. 12) omit a member fixing the semiconductor module and the control board. Here, the X direction of FIG. 1 to FIG. 4 (same in FIG. 5 to FIG. 12) is a width direction of the semiconductor module unit of the embodiment. The Y direction is a depth direction of the semiconductor module unit of the embodiment, and is a direction orthogonal to the width direction. The Z direction is a vertical direction of the semiconductor module unit of the embodiment, and is a direction orthogonal to the width direction and the depth direction. The Z1 direction is an upper direction, and the Z2 direction is a lower direction.

A semiconductor module unit 1A of the embodiment forms a part of an inverter provided in a vehicle such as an electric vehicle (EV), a hybrid vehicle (HEV), and a plug-in hybrid vehicle (PHEV), for example. The inverter converts DC power of a battery provided in the vehicle into AC power. The semiconductor module unit 1A is formed including a control board 2 and a semiconductor module 3A, as illustrated in FIG. 1 and FIG. 2.

The control board 2 is what is called a rigid flexible printed circuit board, and is a circuit board on which at least a control circuit controlling the semiconductor module 3A is mounted. The control board 2 includes a driver circuit 52 configured to output drive signals to the semiconductor module 3A. The control board 2 is formed by a main board 4, a sub board 5A, and a flexible board 6. In the control board 2, the main board 4 is electrically connected to the sub board 5A through the flexible board 6. The main board 4 is what is called a rigid board on which various electronic parts (not illustrated) are mounted, and is a part forming a control circuit connecting the electronic parts electrically. The electronic parts include, for example, a capacitor, a relay, a resistance, a transistor, an intelligent power switch (IPS), and an electronic control unit including a microcomputer. The main board 4 has a wiring pattern (print pattern) printed by a conductive material such as copper on an insulating layer made of an insulating material such as epoxy resin, glass epoxy resin, paper epoxy resin, and ceramic. The main board 4 may be multilayered in which a plurality of insulating layers with a printed wiring pattern are laminated (that is, a multilayer board). The main board 4 is fixed to a housing (not illustrated) and the like forming a part of the inverter, for example. The housing is made of an insulating resin member and the like, for example. The main board 4 of the embodiment is positioned in parallel with the width direction of the semiconductor module 3A, and is arranged on the upper side of the upper surface of the semiconductor module 3A.

The sub board 5A is a rigid board separated from the main board 4, and is a part on which the driver circuit 52 is mounted. The driver circuit 52 outputs drive signals for driving the semiconductor module 3A. The driver circuit 52 is electrically connected to a control circuit on the main board 4 through the flexible board 6, and outputs drive signals to the semiconductor module 3A in accordance with control signals from the control circuit. The sub board 5A includes a board main body 51 and a fitting part 53 fitted in a fitted part 23 of the semiconductor module 3A. The board main body 51 has the same configuration as the above-described main board 4, for example, and is a part on which the driver circuit 52 is mounted. The fitting part 53 includes a projecting portion 53a formed in a projecting shape projecting outward from the outer peripheral end of the sub board 5A, as illustrated in FIG. 2 and FIG. 3. The projecting portion 53a is formed on the outer peripheral end in the opposite direction of the connection part with the flexible board 6 in the width direction of the board main body 51. Moreover, the fitting part 53 includes a connecting portion 54 arranged at the projecting portion 53a and connected electrically to a connected portion 24 of the fitted part 23. The connecting portion 54 is what is called a pad or a land provided in the sub board 5A, and is connected electrically to the driver circuit 52 through a copper foil pattern from the pad or the like. The pad or the like is formed on the copper foil pattern, for example, and is a part on which electronic parts and the like are soldered.

The flexible board 6 is what is called a flexible printed circuits (FPC), has flexibility, and is a part electrically connecting the main board 4 and the sub board 5A. The flexible board 6 has a structure in which an adhesive layer is formed on a thin-film insulator (base film) and a conductive foil is further attached thereon, for example.

The semiconductor module 3A performs energization or shut-off of a high-voltage circuit in the inverter, for example. The semiconductor module 3A is formed in a rectangular shape, and is fixed to a heat radiating member (not illustrated) such as a heat radiating plate. This heat radiating member may be formed to be held by the housing to which the main board 4 is fixed, for example. The semiconductor module 3A is formed including a semiconductor element (not illustrated), an insulating resin member 21, an electrode plate 22, the fitted part 23, and the connected portion 24.

The semiconductor element is a switching element formed by a metal oxide semiconductor field-effect transistor (MOSFET), an insulated gate bipolar transistor (IGBT), and the like. The semiconductor element is turned on or off by control signals input from the driver circuit 52 through the connected portion 24.

The resin member 21 seals the semiconductor element, the electrode plates 22, and the connected portion 24, and forms the fitted part 23. The resin member 21 is made of epoxy resin, silicone resin, or the like, for example.

The electrode plate 22 is a metal plate with one end electrically connected to the semiconductor element and the other end exposed from the resin member 21. The electrode plate 22 is exposed from the outer side surface in the width direction of the semiconductor module 3A.

The fitted part 23 is a part in which the fitting part 53 of the sub board 5A is fitted. The fitted part 23 includes a recessed portion 23a formed in a recessed shape corresponding to the projecting portion 53a of the sub board 5A. The recessed portion 23a is formed to be open in a rectangular shape on the surface in the upper direction of the semiconductor module 3A, and extends from the upper direction to the lower direction. Moreover, the fitted part 23 includes the connected portion 24 arranged at a position facing the connecting portion 54 in the state where the projecting portion 53a of the sub board 5A is fitted in the recessed portion 23a. The connected portion 24 is a control terminal for controlling the semiconductor element in the semiconductor module 3A. The connected portion 24 has one end electrically connected to the semiconductor element and the other end exposed from the resin member 21. The connected portion 24 is arranged at a position facing the connecting portion 54 on the sub board 5A side in the state where the fitting part 53 is fitted in the fitted part 23. The connected portion 24 has elasticity, and is formed to be elastically deformable in the direction facing the connecting portion 54. The connected portion 24 of the embodiment is made of a flat plate form conductive member. As illustrated in FIG. 3, a part extending in the upper direction of the semiconductor module 3A is folded to the lower direction in the midway, and the end extending in the lower direction is folded with an obtuse angle toward one side in the width direction.

The following will briefly describe the procedure of assembling the semiconductor module unit 1A of the embodiment with reference to FIG. 4. First, an operator fixes the semiconductor module 3A to a heat radiating member or the like, for example. Next, the operator fixes the main board 4 of the control board 2, and then assembles the sub board 5A to the semiconductor module 3A. To be more specific, the operator fixes the main board 4, and then fits the fitting part 53 of the sub board 5A in the fitted part 23 of the semiconductor module 3A. Here, the connecting portion 54 of the fitting part 53 is pressed by elastic force of the connected portion 24 to the connecting portion 54 side in the width direction, so that the connected portion 24 is elastically deformed, whereby the sub board 5A is fixed to the semiconductor module 3A.

As described above, in the semiconductor module unit 1A of the embodiment, the control board 2 includes the main board 4, the sub board 5A separated from the main board 4, and the flexible board 6 having flexibility and electrically connecting the main board 4 and the sub board 5A. This makes it unnecessary to perform the conventional assembling work in which after the semiconductor module 3A is fixed to a heat radiating member and the main board 4 is aligned, the semiconductor module 3A and the main board 4 are soldered, thus improving assembling workability.

Moreover, in the semiconductor module unit 1A of the embodiment, the sub board 5A includes the fitting part 53 fitted in the fitted part 23 of the semiconductor module 3A, and the semiconductor module 3A is electrically connected to the driver circuit 52 in the state where the fitting part 53 of the semiconductor module 3A is fitted in the fitted part 23. This makes it unnecessary to use a connector or a wire for connection between the semiconductor module 3A and the sub board 5A, thereby contributing to reduction of the number of parts and downsizing of the unit. Moreover, the sub board 5A on which the driver circuit 52 is mounted is connected directly to the semiconductor module 3A, which allows the driver circuit 52 to be disposed in the vicinity of the semiconductor module 3A. In this manner, a cable way between the semiconductor module 3A and the driver circuit 52 is shortened, whereby it is possible to reduce inductance components occurring in the cable way and reduce occurrence of ringing and noises.

Moreover, in the semiconductor module unit 1A of the embodiment, the fitting part 53 includes the connecting portion 54 arranged in the projecting portion 53a, and the fitted part 23 includes the connected portion 24 arranged facing the connecting portion 54 in the state where the projecting portion 53a is fitted in the recessed portion 23a. In this manner, it is possible to easily align the semiconductor module 3A and the sub board 5A, and thus improve assembling workability.

Moreover, in the semiconductor module unit 1A of the embodiment, the connected portion 24 has elasticity, and is formed to be elastically deformable in the direction facing the connecting portion 54. In this manner, the connecting portion 54 is pressed by elastic force of the connected portion 24, and the elastic deformation of the connected portion 24 allows the sub board 5A to be fixed to the semiconductor module 3A.

Note that although in the first embodiment, the recessed portion 23a in the fitted part 23 is formed to be open in a rectangular shape on the surface in the upper direction of the semiconductor module 3A, the invention is not limited thereto, and the recessed portion 23a may be formed to be open on the side surface of the semiconductor module 3A. For example, the recessed portion 23a may be formed on the side surface facing the main board 4 of the semiconductor module 3A. In this case, in the state where the fitting part 53 is fitted in the fitted part 23, the sub board 5A does not project in the upper direction of the semiconductor module 3A, thereby enabling downsizing of the unit.

Moreover, although in the above-described first embodiment, the sub board 5A is fixed to the semiconductor module 3A by elastic force of the connected portion 24, the invention is not limited thereto. For example, the configuration may be such that the recessed portion 23a is formed in a tapered shape narrowing from the opening toward the lower direction, so that the sub board 5A is pressed into the semiconductor module 3A. Alternatively, the fitting part 53 and the fitted part 23 in the fitted state may be fixed by filling a gap therebetween with an adhesive or the like.

Moreover, although in the above-described first embodiment, the main board 4 is at a position parallel to the width direction of the semiconductor module 3A, and is arranged on the outer side than the upper surface of the semiconductor module 3A, as illustrated in FIG. 3, the invention is not limited thereto. For example, the main board 4 may be at a position along the width direction of the semiconductor module 3A, and may be arranged on the lower side than the upper surface of the semiconductor module 3A, as illustrated by a dashed line of FIG. 4.

Second Embodiment

Figure 5:
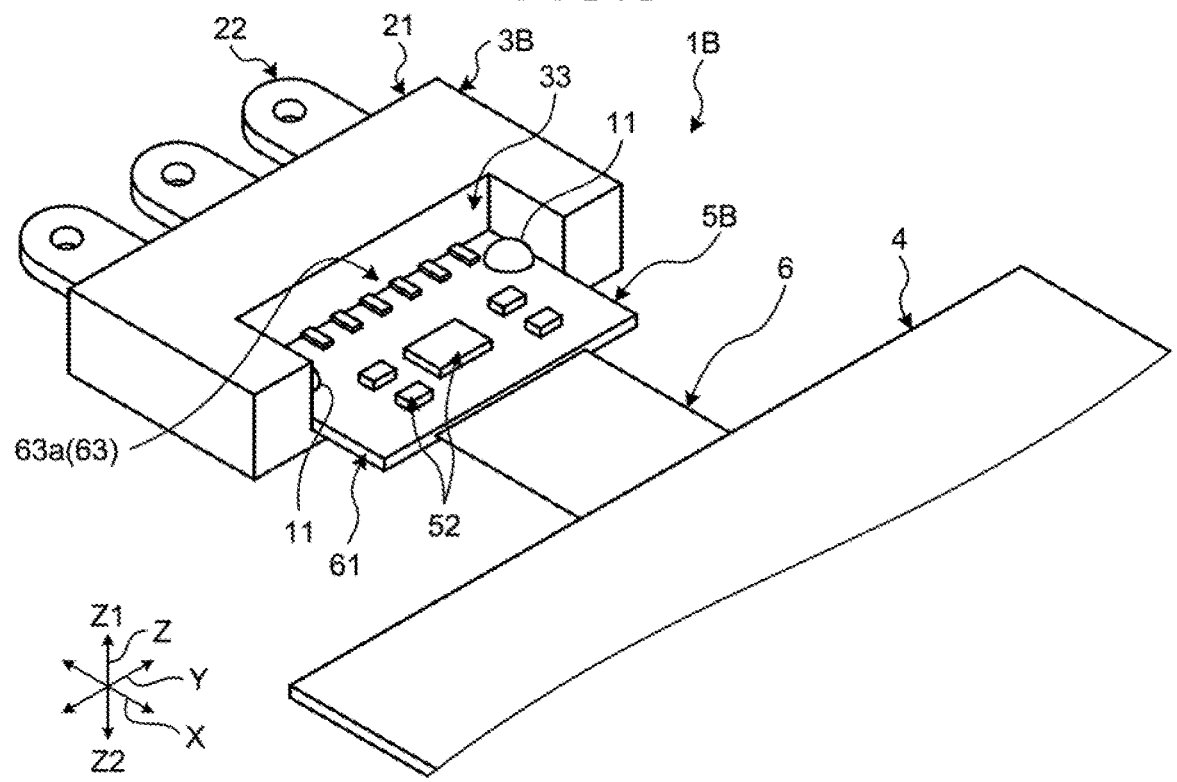
FIG. 5 is a perspective view illustrating a schematic configuration of a semiconductor module according to a second embodiment.
Figure 6:
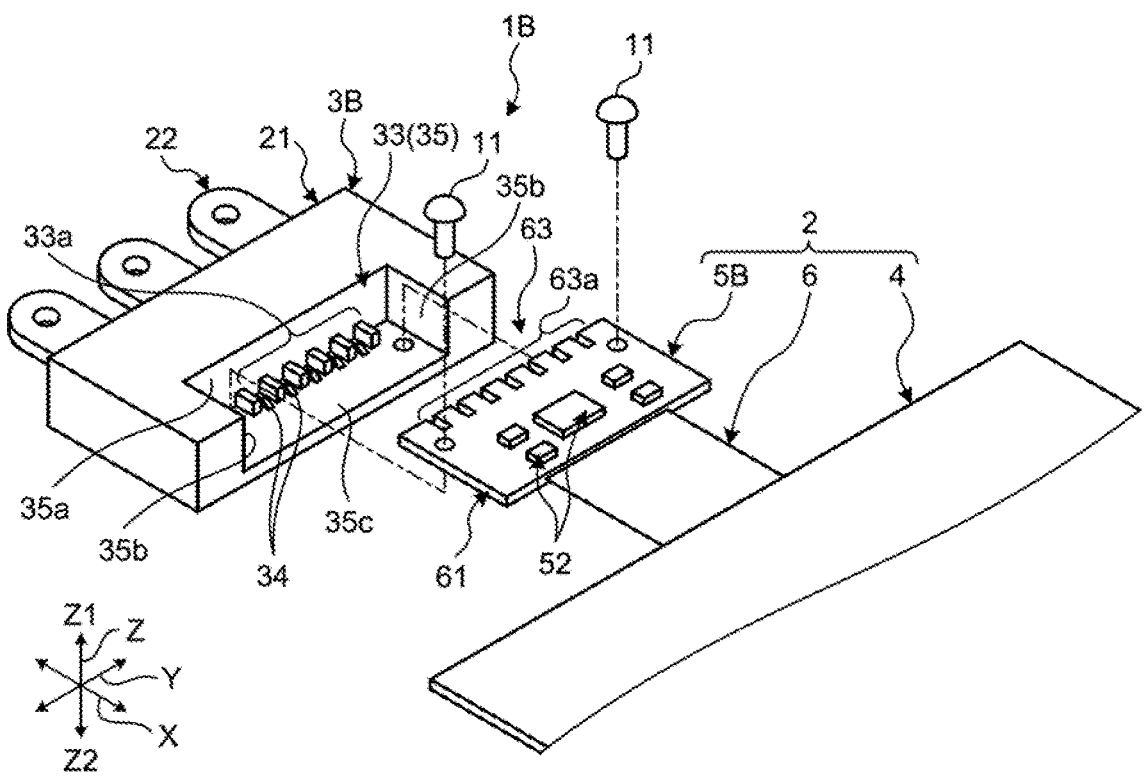
FIG. 6 is an exploded perspective view illustrating a schematic configuration of the semiconductor module unit according to the second embodiment.
Figure 7:
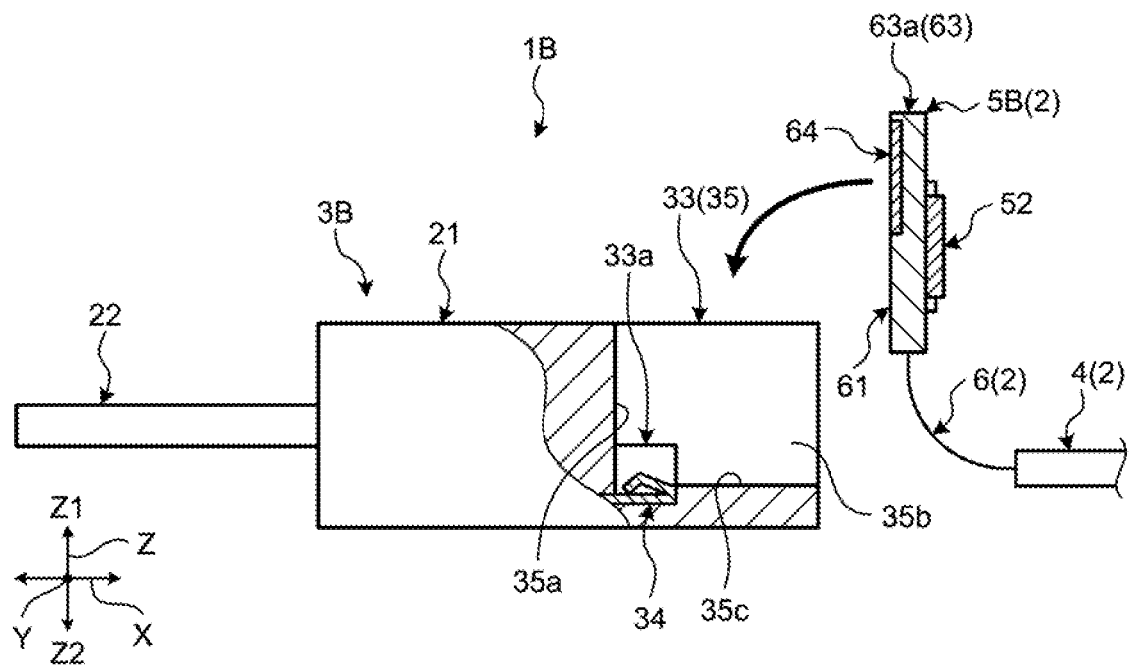
FIG. 7 is a partial section view of the semiconductor module unit according to the second embodiment.
Figure 8:
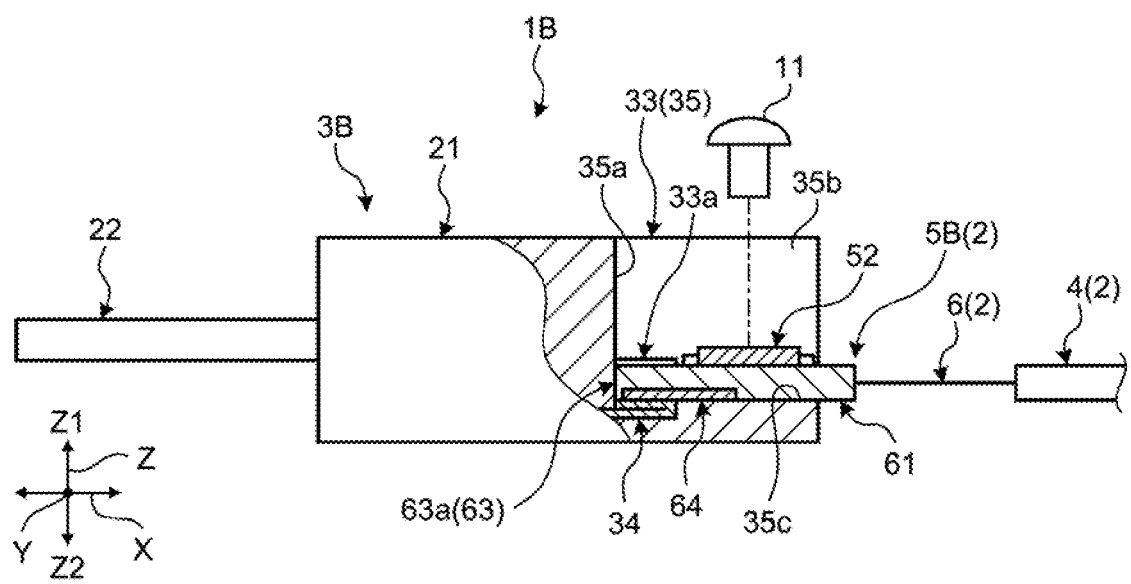
FIG. 8 is a partial section view of the semiconductor module unit according to the second embodiment.

The following will describe a semiconductor module unit according to the second embodiment of the invention with reference to FIG. 5 to FIG. 8. FIG. 5 is a perspective view illustrating a schematic configuration of the semiconductor module unit according to the second embodiment. FIG. 6 is an exploded perspective view illustrating a schematic configuration of the semiconductor module unit according to the second embodiment. FIG. 7 is a partial section view of the semiconductor module unit according to the second embodiment. FIG. 8 is a partial section view of the semiconductor module unit according to the second embodiment.

A semiconductor module unit 1B of the second embodiment is different from the semiconductor module unit 1A of the above-described first embodiment in that the shape of each of a fitted part 33 of a semiconductor module 3B and a fitting part 63 of a sub board 5B is different. Note that as compared with the semiconductor module unit 1A of the above-described first embodiment, the semiconductor module unit 1B of the second embodiment has the common basic configurations and basic actions. Thus, the description of the parts with the same reference numerals will be omitted or simplified.

The semiconductor module unit 1B of the second embodiment is formed including the control board 2 and the semiconductor module 3B, as illustrated in FIG. 5 and FIG. 6. The control board 2 is formed by the main board 4, the sub board 5B, and the flexible board 6. In the control board 2, the main board 4 is electrically connected to the sub board 5B through the flexible board 6.

The sub board 5B is a rigid board separated from the main board 4, and is a part on which the driver circuit 52 is mounted. The driver circuit 52 outputs drive signals for driving the semiconductor module 3B. The driver circuit 52 is electrically connected to a control circuit (not illustrated) on the main board 4 through the flexible board 6, and outputs drive signals to the semiconductor module 3B in accordance with control signals from the control circuit. The sub board 5B includes a board main body 61 and the fitting part 63 fitted in the fitted part 33 of the semiconductor module 3B. The board main body 61 has the same configuration as the main board 4, and is a part on which the driver circuit 52 is mounted. The fitting part 63 has a recessed-projecting portion 63a formed in a recessed-projecting shape at a part of the outer peripheral end of the sub board 5B, as illustrated in FIG. 6. The recessed-projecting portion 63a is formed on the outer peripheral end in the opposite direction of the connection part with the flexible board 6 in the width direction of the board main body 61. The fitting part 63 includes a connecting portion 64 arranged at the recessed-projecting portion 63a and connected electrically to a connected portion 34 of the fitted part 33. The connecting portion 64 is a pad or the like provided on the sub board 5B, and is electrically connected to the driver circuit 52 through a copper foil pattern from the pad or the like. The sub board 5B of the embodiment is fixed to the semiconductor module 3B by two male screws 11 in the state where the fitting part 63 is fitted in the fitted part 33.

The semiconductor module 3B performs energization or shut-off of a high-voltage circuit in the inverter, for example. The semiconductor module 3B is formed in a rectangular shape, and is fixed to a heat radiating member such as a heat radiating plate. The semiconductor module 3B is formed including a semiconductor element (not illustrated), the insulating resin member 21, the electrode plate 22, the fitted part 33, and the connected portion 34.

The fitted part 33 is a part fitted in the fitting part 63 of the sub board 5B. The fitted part 33 has a projecting-recessed portion 33a formed in a projecting-recessed shape corresponding to the recessed-projecting portion 63a of the sub board 5B. The projecting-recessed portion 33a is provided on a step 35 formed in the semiconductor module 3B. The step 35 is formed by a first side surface 35a formed along the depth direction of the semiconductor module 3B, second side surfaces 35b formed at a position adjacent to the first side surface 35a to face each other in the depth direction, and a bottom surface 35c extending to the ends in the width direction. In the projecting-recessed portion 33a, the projecting portion extends along the width direction from the first side surface 35a and extends along the upper direction from the bottom surface 35c.

The fitted part 33 includes the connected portion 34 arranged at a position facing the connecting portion 64 in the state where the recessed-projecting portion 63a of the fitting part 63 is fitted in the projecting-recessed portion 33a. The connected portion 34 is a control terminal for controlling the semiconductor element in the semiconductor module 3B. The connected portion 34 has one end electrically connected to the semiconductor element and the other end exposed from the resin member 21. The connected portion 34 is arranged at a position facing the connecting portion 64 on the sub board 5B side in the state where the fitting part 63 is fitted in the fitted part 33. The connected portion 34 has elasticity, and is formed to be elastically deformable in the direction facing the connecting portion 64. The connected portion 34 of the embodiment is made of a flat plate form conductive member. As illustrated in FIG. 7, a part extending to one side in the width direction of the semiconductor module 3B is folded in the midway to the other side in the width direction, and the end extending to the other side in the width direction is folded with an obtuse angle toward the upper direction.

The following will briefly describe the procedure of assembling the semiconductor module unit 1B of the embodiment with reference to FIG. 7 and FIG. 8. First, an operator fixes the semiconductor module 3B to a heat radiating member or the like, for example. Next, the operator fixes the main board 4 of the control board 2 and then assembles the sub board 5B to the semiconductor module 3B. To be more specific, the operator fixes the main board 4, and then fits the fitting part 63 of the sub board 5B in the fitted part 33 of the semiconductor module 3B. Next, the operator screws the two male screws 11 into screw holes provided on the semiconductor module 3B side and fastens them. Here, the connected portion 34 of the fitted part 33 is pressed downward by the connecting portion 64 and elastically deformed, which increases the degree of adhesion with the connecting portion 64 and increases axial force of the male screws 11.

As described above, the semiconductor module unit 1B of the embodiment exerts the same effects as the above-described semiconductor module unit 1A, and prevents, with screwing of the sub board 5B into the semiconductor module 3B, for example, connection failure between the semiconductor module 3B and the sub board 5B by vibration and the like. Moreover, in the semiconductor module unit 1B of the embodiment, the recessed-projecting portion 63a is formed in the fitting part 63 of the sub board 5B, and the projecting-recessed portion 33a is formed in the fitted part 33 of the semiconductor module 3B. Thus, it is possible to prevent deviation of the positions of the semiconductor module 3B and the sub board 5B in the state where the fitting part 63 is fitted in the fitted part 33. Moreover, in the semiconductor module unit 1B of the embodiment, the sub board 5B does not project in the upper direction of the semiconductor module 3B in the state where the fitting part 63 is fitted in the fitted part 33, thus enabling downsizing of the unit.

Moreover, in the semiconductor module unit 1B of the embodiment, the fitting part 63 includes the connecting portion 64 arranged in the recessed-projecting portion 63a, and the fitted part 33 includes the connected portion 34 arranged facing the connecting portion 64 in the state where the recessed-projecting portion 63a is fitted in the projecting-recessed portion 33a. In this manner, it is possible to easily align the semiconductor module 3B and the sub board 5B, and thus improve assembling workability.

Moreover, in the semiconductor module unit 1B of the embodiment, the connected portion 34 has elasticity, and is formed to be elastically deformable in the direction facing the connecting portion 64. Thus, in the state where the fitting part 63 is fitted in the fitted part 33, the connecting portion 64 is pressed by elastic force of the connected portion 34, and the elastic deformation of the connected portion 34 increases the degree of adhesion between the connected portion 34 and the connecting portion 64 and increases axial force of the male screws 11.

Figure 9:
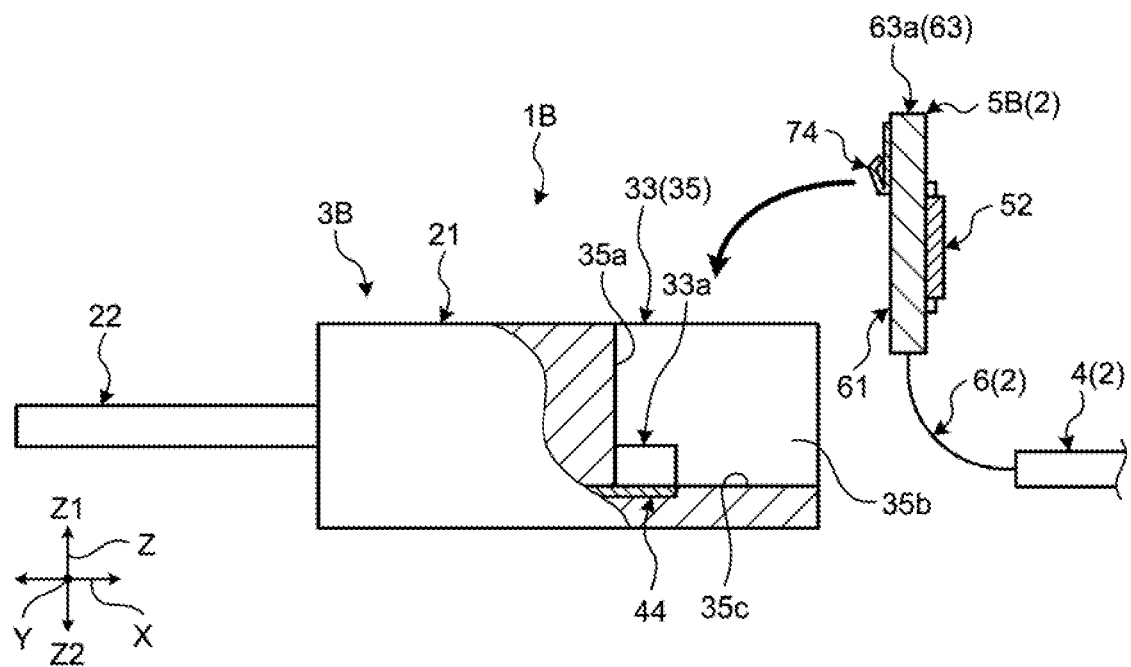
FIG. 9 is a partial section view of a semiconductor module unit according to a modification of the second embodiment.
Figure 10:
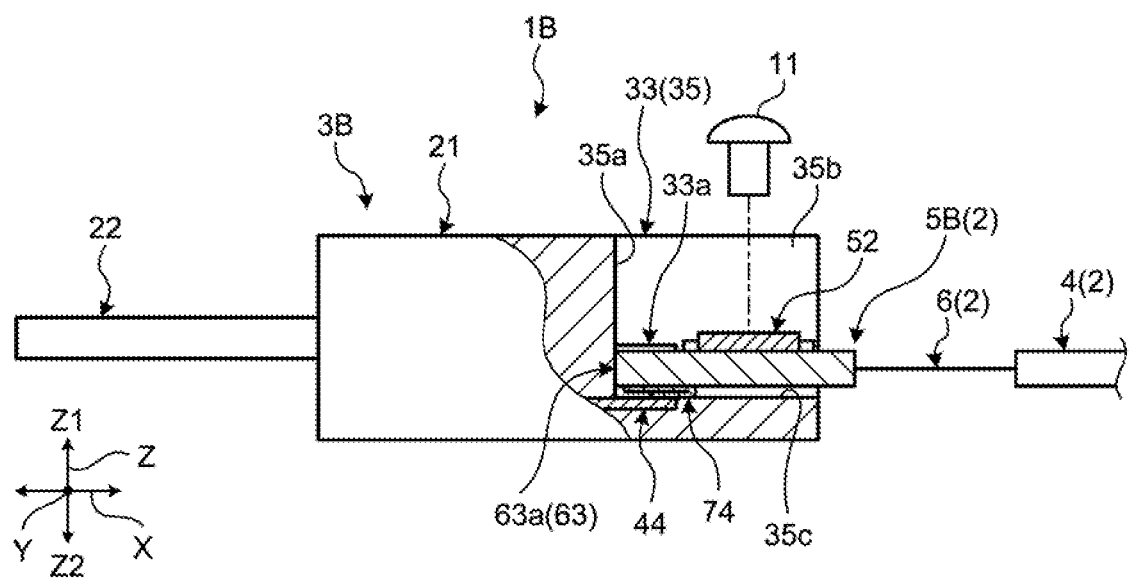
FIG. 10 is a partial section view of a semiconductor module unit according to a modification of the second embodiment.

Note that in the above-described second embodiment, the connected portion 34 is formed to be elastically deformable in the direction facing the connecting portion 64. However, the invention is not limited thereto. FIG. 9 and FIG. 10 are partial section views of a semiconductor module unit according to a modification of the second embodiment. As illustrated in FIG. 9 and FIG. 10, a connecting portion 74 may be a conductive member having elasticity. The connecting portion 74 is a terminal processed by folding a metal plate, for example. The connecting portion 74 is formed to be elastically deformable in the direction facing a connected portion 44. In the connecting portion 74, as illustrated in FIG. 9, a part extending along one side in the extending direction of the sub board 5B is folded in the midway to the other side in the extending direction, and the end extending to the other side in the extending direction is processed to be folded outward with an obtuse angle. The connecting portion 74 is soldered to the pad or the like formed on the sub board 5B, and is electrically connected to the driver circuit 52 through a copper foil pattern from the pad or the like. The connected portion 44 is a control terminal for controlling the semiconductor element in the semiconductor module 3B. The connected portion 44 has one end electrically connected to the semiconductor element and the other end exposed from the resin member 21. The connected portion 44 is arranged at a position facing the connecting portion 74 on the sub board 5B side in the state where the fitting part 63 is fitted in the fitted part 33. In this manner, the connecting portion 74 of the sub board 5B is formed to be elastically deformable in the direction facing the connected portion 44. This makes it unnecessary to process the connected portion 44 on the semiconductor module 3B side to be elastically deformable, thereby reducing the manufacturing costs of the semiconductor module 3B. Moreover, in the state where the fitting part 63 is fitted in the fitted part 33, the connected portion 44 is pressed by elastic force of the connecting portion 74, and the elastic deformation of the connecting portion 74 increases the degree of adhesion between the connected portion 44 and the connecting portion 74 and increases axial force of the male screws 11.

Third Embodiment

Figure 11:
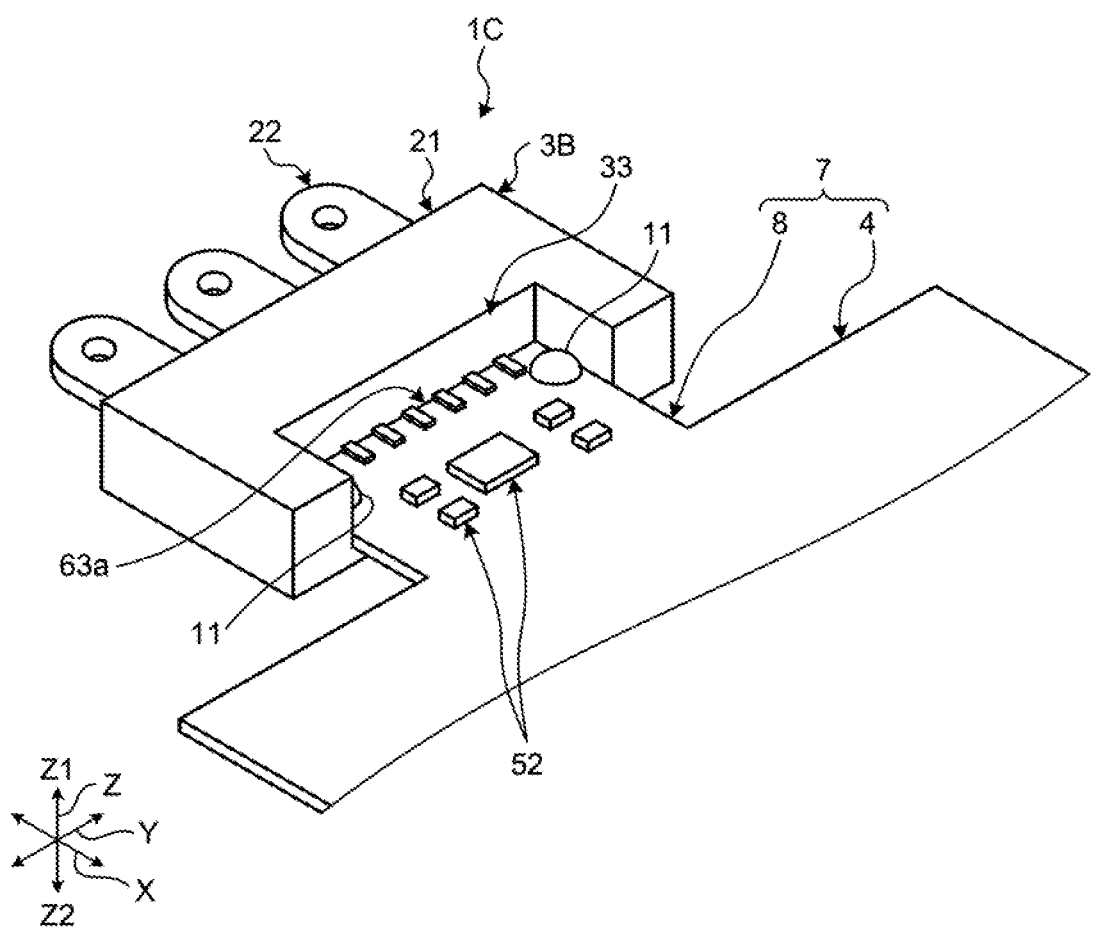
FIG. 11 is a perspective view illustrating a schematic configuration of a semiconductor module unit according to a third embodiment.
Figure 12:
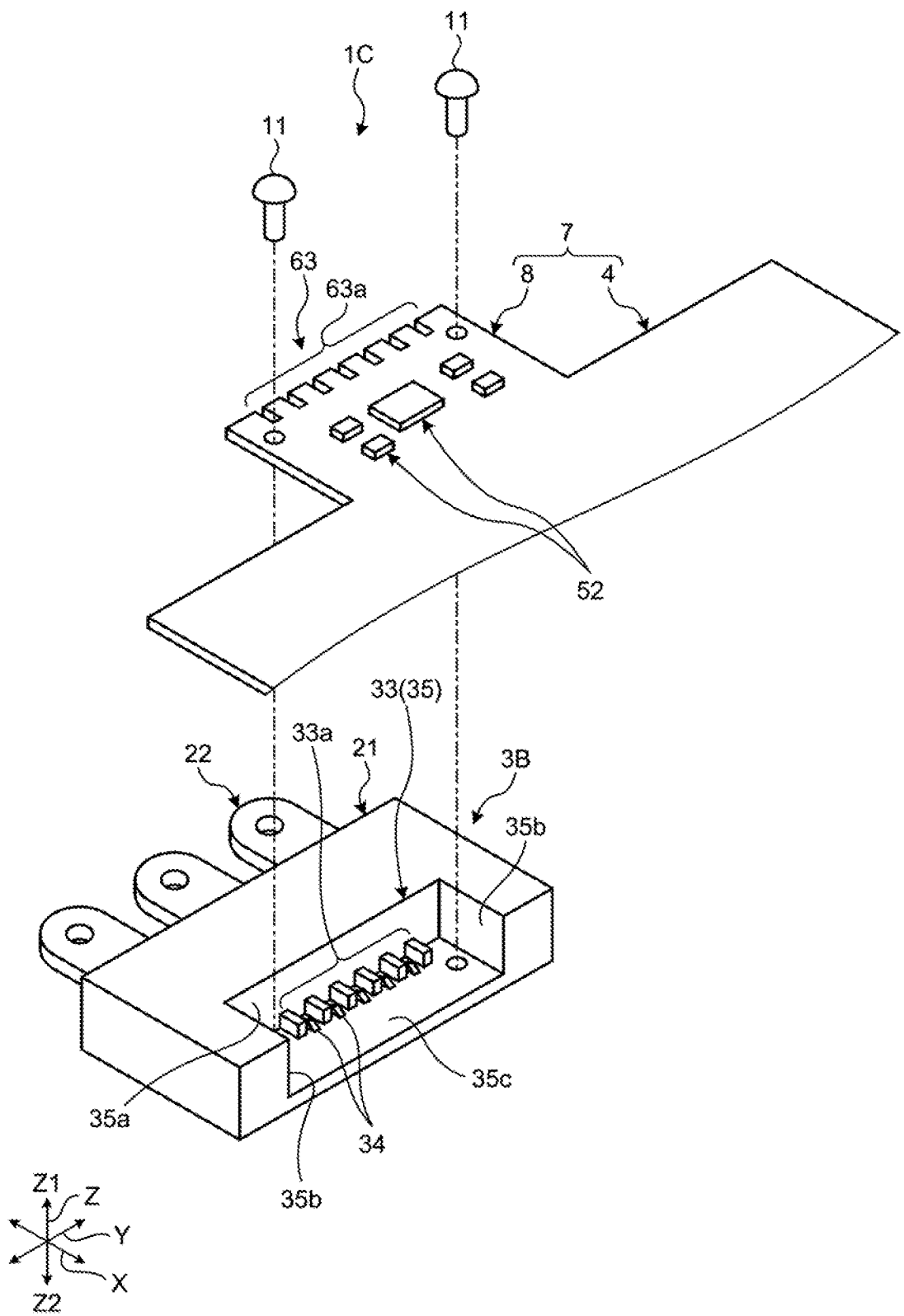
FIG. 12 is an exploded perspective view illustrating a schematic configuration of the semiconductor module unit according to the third embodiment.

The following will describe a semiconductor module unit according to the third embodiment of the invention with reference to FIG. 11 and FIG. 12. FIG. 11 is a perspective view illustrating a schematic configuration of the semiconductor module unit according to the third embodiment. FIG. 12 is an exploded perspective view illustrating a schematic configuration of the semiconductor module unit according to the third embodiment.

A semiconductor module unit 1C of the third embodiment is different from the semiconductor module unit 1B of the above-described second embodiment in that a control board 7 does not include the flexible board 6 and includes the main board 4 and a projecting part 8. Note that as compared with the semiconductor module unit 1B of the above-described second embodiment, the semiconductor module unit 1C of the third embodiment has the common basic configurations and basic actions. Thus, the description of the parts with the same reference numerals will be omitted or simplified.

The semiconductor module unit 1C of the third embodiment is formed including the control board 7 and the semiconductor module 3B, as illustrated in FIG. 11 and FIG. 12. The control board 7 is what is called a rigid board, and is a circuit board on which at least a control circuit controlling the semiconductor module 3B is mounted. The control board 7 includes the driver circuit 52 configured to output drive signals to the semiconductor module 3B. The control board 7 includes the main board 4 and the projecting part 8. The control board 7 includes the projecting part 8 projecting along the extending direction at a part of the outer peripheral end of the main board 4.

The projecting part 8 is a part on which the driver circuit 52 is mounted. The driver circuit 52 outputs drive signals for driving the semiconductor module 3B. The driver circuit 52 is electrically connected to a control circuit on the main board 4, and outputs drive signals to the semiconductor module 3B in accordance with control signals from the control circuit. The projecting part 8 includes the fitting part 63 fitted in the fitted part 33 of the semiconductor module 3B. The fitting part 63 has the recessed-projecting portion 63a formed in a recessed-projecting shape on the end of the projecting part 8, as illustrated in FIG. 11. The recessed-projecting portion 63a is formed on the end in the opposite direction from the main board 4 side in the width direction. The fitting part 63 includes the connecting portion 64 arranged at the recessed-projecting portion 63a and connected electrically to the connected portion 34 of the fitted part 33. The connecting portion 64 is a pad or the like formed on the main board 4, and is electrically connected to the driver circuit 52 through a copper foil pattern. In the main board 4 of the embodiment, the projecting part 8 is fixed to the semiconductor module 3B by the two male screws 11 in the state where the fitting part 63 is fitted in the fitted part 33. The fitted part 33 is a part in which the fitting part 63 of the projecting part 8 is fitted. The fitted part 33 includes the connected portion 34 arranged at a position facing the connecting portion 64 in the state where the recessed-projecting portion 63a of the fitting part 63 is fitted in the projecting-recessed portion 33a.

The following will briefly describe the procedure of assembling the semiconductor module unit 1C according to the embodiment with reference to FIG. 12. First, an operator fixes the semiconductor module 3B to a heat radiating member or the like. Next, the operator fixes the control board 7 and assembles the projecting part 8 to the semiconductor module 3B. To be more specific, the operator fits the fitting part 63 of the projecting part 8 in the fitted part 33 of the semiconductor module 3B while fixing the main board 4. Next, the operator screws the two male screws 11 into screw holes provided on the semiconductor module 3B side and fastens them. Here, the connected portion 34 of the fitted part 33 is pressed downward by the connecting portion 64 and elastically deformed, which increases the degree of adhesion with the connecting portion 64 and increases axial force of the male screws 11.

As described above, in the semiconductor module unit 1C of the embodiment, the main board 4 and the sub board 5B are integrated without the flexible board 6 interposed. Thus, it is possible to reduce the number of parts and reduce the manufacturing costs.

Modification

Note that although in the above-described first and second embodiments, the flexible board 6 is made of FPC, the invention is not limited thereto, and the flexible board 6 may be a flexible cable including a flexible flat cable. Thus, it is possible to reduce costs than the flexible board 6.

Moreover, although in the above-described first to third embodiments, the connected portions 24, 34, and the connecting portion 74 are processed by folding a flat plate form conductive member so as to have elasticity, the invention is not limited thereto. For example, they may be provided with projections.

The semiconductor module according to the embodiment exerts the effects of improving assembling workability and reducing occurrence of noises.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor module unit, comprising:
a semiconductor module that includes at least a semiconductor element; and
a control board that includes a driver circuit configured to output a drive signal to the semiconductor module and controls the semiconductor module, wherein
the control board includes
a main board,
a sub board that is separated from the main board and on which the driver circuit is mounted, and
a flexible board that has flexibility and electrically connects the main board and the sub board,
the sub board includes
a fitting part that is fitted to the semiconductor module, and
a connecting portion that is arranged in the fitting part, and is electrically connected to the driver circuit,
the semiconductor module includes
a fitted part that is made of a resin member sealing the semiconductor element and that is fitted to the fitting part, and
a connected portion with one end electrically connected to the semiconductor element, an other end exposed from the resin member and the other end arranged in the fitted part, and
the semiconductor module is electrically connected to the driver circuit by a connection of the fitting part and the fitted part when the fitting part is fitted in the fitted part as a solderless connection.

2. The semiconductor module unit according to claim 1, wherein
the fitting part includes
a projecting portion that is formed in a projecting shape projecting outward from an outer peripheral end of the sub board and on which the connecting portion is arranged, and
the fitted part includes
a recessed portion that is formed in a recessed shape corresponding to the projecting portion, and
the connected portion is arranged at a position facing the connecting portion when the projecting portion is fitted in the recessed portion.

3. The semiconductor module unit according to claim 1, wherein
the fitting part includes
a recessed-projecting portion that is formed in a recessed-projecting shape on a part of an outer peripheral end of the sub board and on which the connecting portion is arranged, and
the fitted part includes
a projecting-recessed portion that is formed in a projecting-recessed shape corresponding to the recessed-projecting portion, and
the connected portion is arranged at a position facing the connecting portion when the recessed-projecting portion is fitted in the projecting-recessed portion.

4. The semiconductor module unit according to claim 2, wherein
one of the connecting portion and the connected portion is formed to be elastically deformable in a facing direction of the connecting portion and the connected portion.

5. The semiconductor module unit according to claim 3, wherein
either one of the connecting portion and the connected portion is formed to be elastically deformable in a facing direction of the connecting portion and the connected portion.

6. The semiconductor module unit according to claim 1, wherein
one of the connecting portion and the connected portion is formed to be elastically deformable in a facing direction of the connecting portion and the connected portion.

* * * * *